(12) United States Patent
Kishita

(10) Patent No.: US 6,430,364 B2
(45) Date of Patent: Aug. 6, 2002

(54) COOLING SYSTEM FOR COOLING INTERIOR OF SUBSTANTIALLY AIRTIGHT HOUSING

(75) Inventor: Koji Kishita, Motosu-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/835,955

(22) Filed: Apr. 16, 2001

(30) Foreign Application Priority Data

Apr. 20, 2000 (JP) ........................................ 2000-119423

(51) Int. Cl.$^7$ ............................... F24H 3/00; H05K 7/20
(52) U.S. Cl. ....................... 392/360; 392/485; 219/530; 219/510; 165/122; 165/48.1
(58) Field of Search ................................ 392/360, 485, 392/351, 352–353; 165/48.1, 122; 219/510, 530

(56) References Cited

U.S. PATENT DOCUMENTS

| | | | |
|---|---|---|---|
| 3,804,156 A | * 4/1974 | McDonough | ............... 165/205 |
| 3,833,052 A | * 9/1974 | Cardinal | ..................... 165/228 |
| 3,924,099 A | * 12/1975 | Housel | ........................ 392/368 |
| 4,641,013 A | * 2/1987 | Dunnigan et al. | .......... 392/347 |
| 6,125,926 A | 10/2000 | Okamoto | |
| 6,132,310 A | * 10/2000 | Baribeault et al. | .......... 454/261 |

FOREIGN PATENT DOCUMENTS

| DE | 549038 | * 4/1932 |
|---|---|---|
| EP | 505116 | * 9/1992 |

* cited by examiner

Primary Examiner—John A. Jeffery
(74) Attorney, Agent, or Firm—Harness, Dickey & Pierce, PLC

(57) ABSTRACT

A heater protective device of a cooling system includes a couple of thermostats and one thermal fuse. The thermostats are secured to opposing sides of one metal plate. When a temperature of each thermostat rises due to the heat conducted through the metal plate and substantially reaches 40 degrees Celsius or higher, an internal connection of the thermostat is turned off, i.e., is opened. When the temperature of the thermostat decreases substantially below 40 degrees Celsius, the internal contact of the thermostat is turned on, i.e., is closed. The metal plate is secured to a heat receiving bracket that is secured to a heater cover and that is heated upon receiving radiated heat from the electric heater. A thermal fuse extends through the metal plate in a thickness direction of the metal plate and is secured thereto.

8 Claims, 5 Drawing Sheets

COOLING SYSTEM FOR COOLING INTERIOR OF SUBSTANTIALLY AIRTIGHT HOUSING

CROSS REFERENCE TO RELATED APPLICATION

This application is based on and incorporates herein by reference Japanese Patent Application No. 2000-119423 filed on Apr. 20, 2000.

BACKGROUND OF THE INVENTION

1. Field of the Invention

The present invention relates to a cooling system for cooling an interior of a substantially airtight housing, such as a housing of a base station of a cellular phone system.

2. Description of Related Art

One type of cooling system for cooling an interior of a substantially airtight housing exchanges heat between internal air located within the housing and external air located outside of the housing to cool the interior of the housing.

This type of cooling system is used, for example, in a base station of a cellular phone system. When a temperature of the external air gets cold (e.g., below freezing temperature), performance of electronic devices arranged, for example, in a transmitter-receiver of the base station is degraded. To address this problem, such a cooling system generally includes an electric heater that heats the internal air located within the housing of the base station.

A power supply circuit that supplies power to the electric heater includes thermostats to prevent abnormally high heat generation of the electric heater. Furthermore, a thermal fuse is additionally provided in the power supply circuit to provide redundancy in case of failure of the thermostats.

The U.S. safety standard requires to provide the thermostat on both sides of the electric heater in the power supply circuit that supplies power to the electric heater. This requirement poses a limitation on arrangement of the thermostats. That is, in case of providing only one thermostat, the best location of the thermostat (such as one location where temperature is close to that of the electric heater and where the thermostat can be easily placed) can be easily selected. However, if two thermostats need to be provided, it is difficult to place both the thermostats at the best locations within a limited space. Furthermore, in order to prevent opening of the thermal fuse before opening of the thermostats, positional relationship between the two thermostats and the thermal fuse needs to be concerned.

SUMMARY OF THE INVENTION

The present invention addresses the described disadvantages. Thus, it is an objective of the present invention to provide a cooling system having a heater unit that includes a couple of thermostats arranged in a manner that achieves a higher degree of safety.

To achieve the objective of the present invention, there is provided a cooling system for cooling an interior of a substantially airtight housing. The cooling system includes an internal-air passage, an external-air passage, an internal-air fan, an external-air fan, a heat exchanger and a heater unit. The internal-air passage has an internal-air inlet and an internal-air outlet. Both the internal-air inlet and the internal-air outlet communicate with an interior of the housing. The external-air passage has an external-air inlet and an external-air outlet. Both the external-air inlet and the external-air outlet communicate with an exterior of the housing. The internal-air fan takes in internal air from the interior of the housing through the internal-air inlet and expels the internal air into the interior of the housing through the internal-air outlet. The external-air fan takes in external air from the exterior of the housing through the external-air inlet and expels the external air to the exterior of the housing through the external-air outlet. The heat exchanger exchanges heat between the internal air introduced into the internal-air passage and the external air introduced into the external-air passage. The heater unit heats the internal air introduced into the internal-air passage. The heater unit includes an electric heater, a power supply circuit, a heater protective device and a heat receiving plate. The electric heater generates heat upon energization. The power supply circuit supplies power to the electric heater. The heater protective device is interposed in the power supply circuit. The heater protective device includes a first thermostat and a second thermostat. The first thermostat is interposed in the power supply circuit on a first side of the electric heater. The second thermostat is interposed in the power supply circuit on a second side of the electric heater that is opposite to the first side of the electric heater. The first thermostat and the second thermostat are arranged to open substantially at a first predetermined temperature or higher to disconnect the power supply circuit. The heat receiving plate receives heat from the electric heater and conducts the heat of the electric heater to the heater protective device. The first thermostat and the second thermostat are secured to the heat receiving plate.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

Embodiments of the present invention will now be described with reference to the accompanying drawings.

First Embodiment

Figure 1:
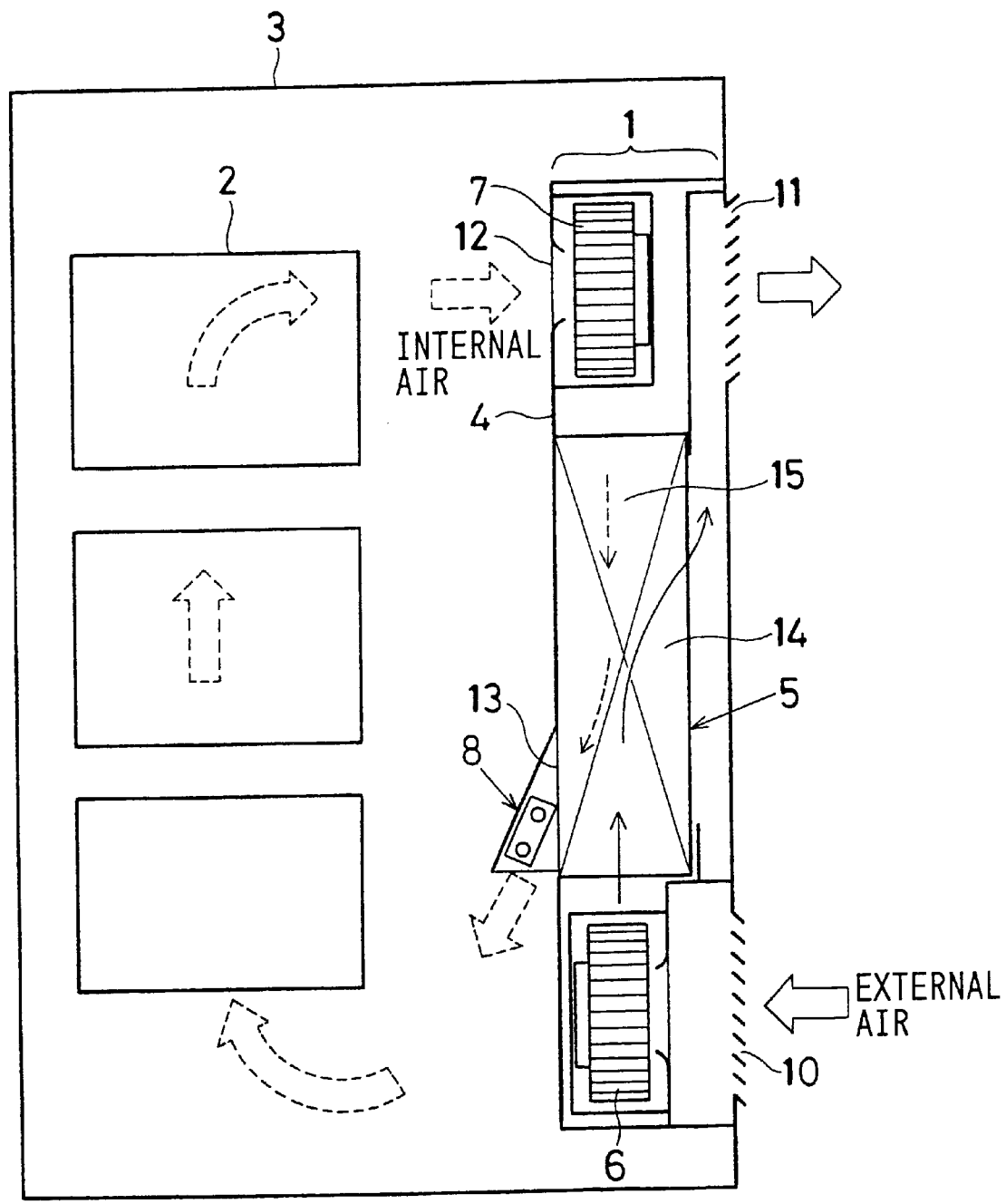
FIG. 1 is a schematic side view of a housing including a cooling system according to a first embodiment of the present invention, schematically showing an internal structure of the cooling system.

With reference to FIG. 1, a cooling system 1 according to a first embodiment of the present invention can be used, for example, in a base station of a mobile radio communication system (e.g., a cellular phone system, automobile telephone system or the like).

Such a base station normally includes electronic devices 2 that are sensitive to foreign matter, such as dust, dirt, moisture, rain, snow or the like. Thus, the base station generally has a substantially airtight housing 3 that receives and protects the electronic devices 2 from the foreign matter.

As shown in FIG. 1, the cooling system 1 is mounted within the housing 3 in such a manner that the cooling system 1 airtightly closes one side of the housing 3. The cooling system 1 includes a casing 4, a heat exchanger 5, an external-air fan 6, an internal-air fan 7, a heater unit 8 (best seen in FIG. 2) and a controller 9 (best seen in FIG. 3).

The casing 4 has an external-air inlet 10 and an external-air outlet 11 on its exterior side. The casing 4 also has an internal-air inlet 12 and an internal-air outlet 13 on its interior side.

The heat exchanger 5 includes a plurality of first and second air passages (both not shown) that are arranged alternately and adjacently in a manner that allows heat exchange between the first air passages and the second air passages.

The casing 4 also accommodates an external-air passage 14 and an internal-air passage 15 that are airtightly separated from each other. The external-air passage 14 communicates the external-air inlet 10 to the external-air outlet 11 through the external-air fan 6 and also through the first air passages of the heat exchanger 5. The internal-air passage 15 communicates the internal-air inlet 12 to the internal-air outlet 13 through the internal-air fan 7 and also through the second air passages of the heat exchanger 5.

The external-air fan 6 faces the external-air inlet 10 and is positioned on the bottom side of the heat exchanger 5. upon energization, the external-air fan 6 rotates to take in the external air through the external-air inlet 10 and then to expel it through the external-air passage 14.

The internal-air fan 7 faces the internal-air inlet 12 and is positioned on the top side of the heat exchanger 5. Upon energization, the internal-air fan 7 rotates to take in the internal air through the internal-air inlet 12 and then to expel it through the internal-air passage 15.

As shown in FIG. 1, the heater unit 8 is arranged at the internal-air outlet 13 of the casing 4 to heat the internal air within the housing 3 when a temperature of the internal air within the housing 3 is substantially equal to or below a predetermined temperature (e.g., 10 degrees Celsius).

Figure 2:
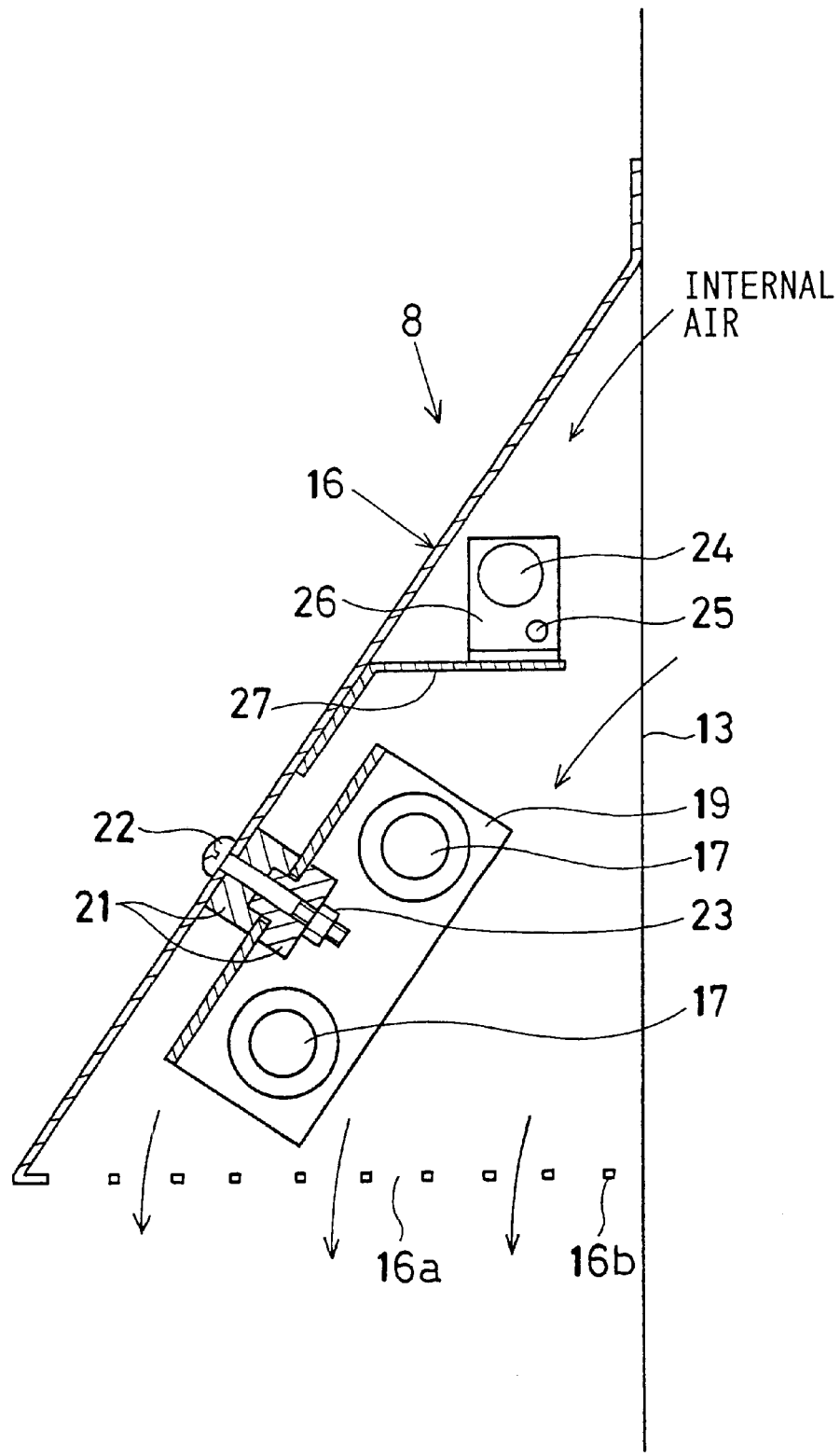
FIG. 2 is a partial enlarged cross-sectional view of a heater unit according to the embodiment.
Figure 3:
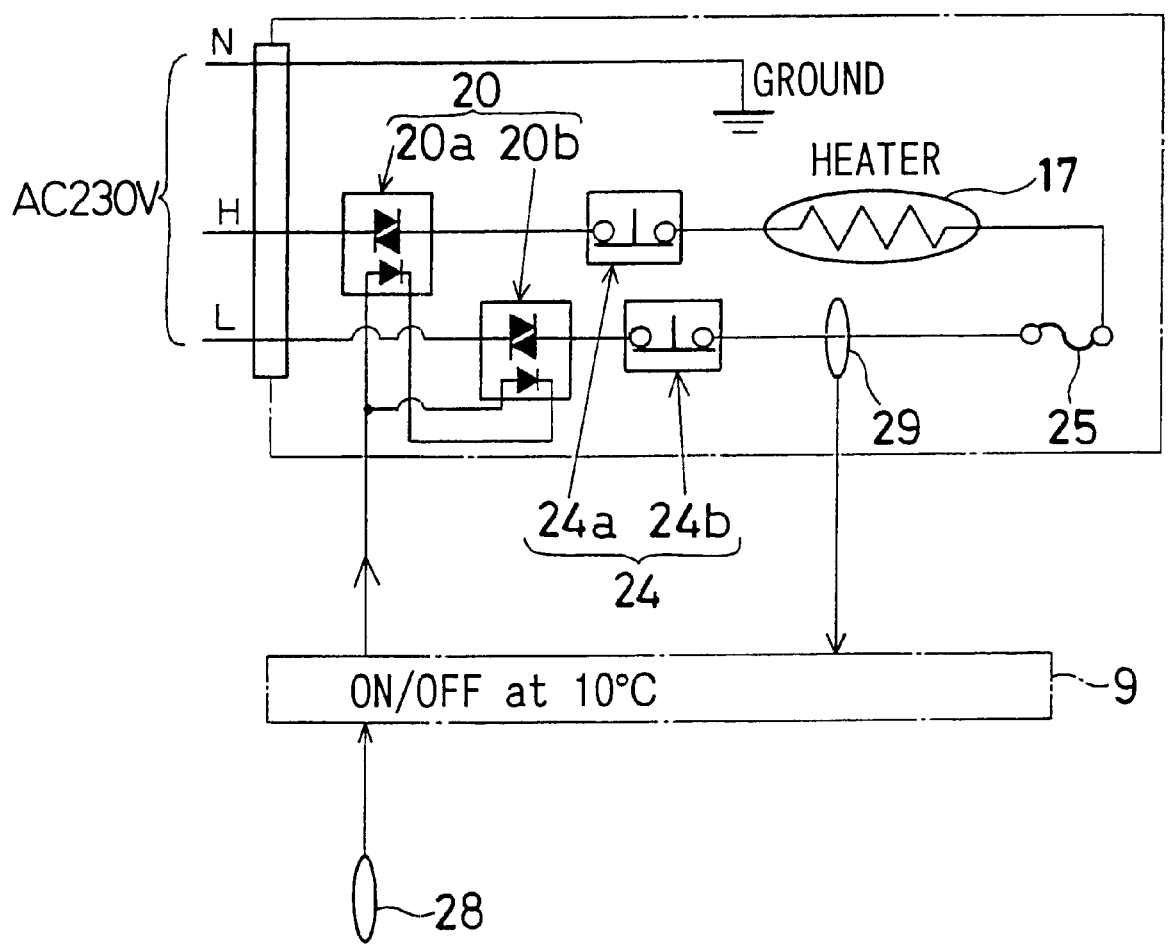
FIG. 3 is an electric arrangement of the heater unit according to the embodiment.

As shown in FIGS. 2 and 3, the heater unit 8 includes a heater cover 16, an electric heater 17 and a heater protective device (to be described later).

The heater cover 16 is secured to a side wall of the casing, 4 such that the heater cover 16 extends at an oblique angle relative to the side wall of the casing 4 to cover the internal-air outlet 13. At a bottom side of the cover 16, there is provided an outlet grille 16b that has a plurality of outlet openings 16a through which the internal air is discharged from the casing 4.

Figure 4:
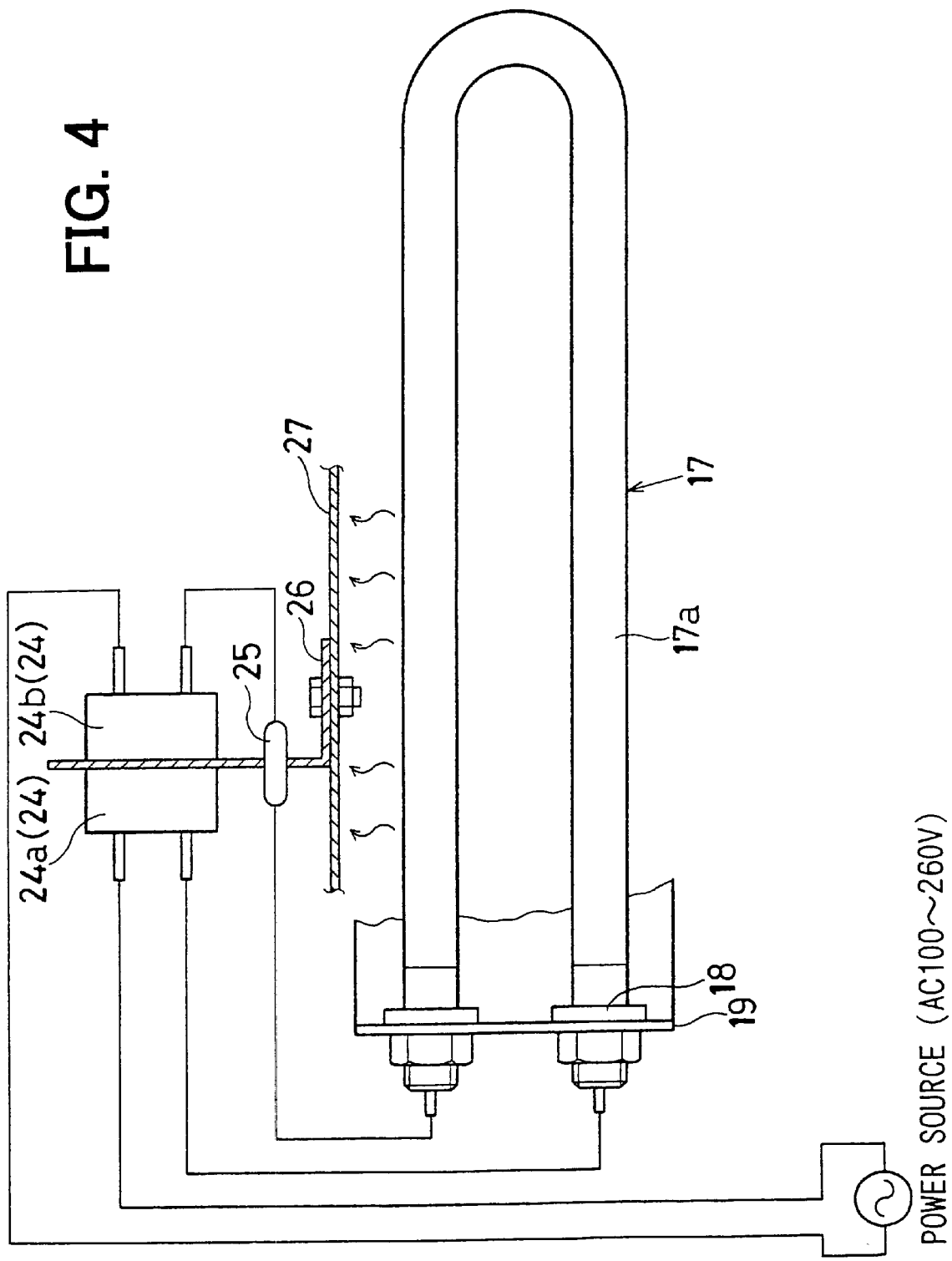
FIG. 4 is a schematic structural view showing arrangement of a heater protective device according to the embodiment.

With reference to FIG. 4, the electric heater 17 includes a pipe 17a. A heating wire (e.g., nichrome wire) extends through an interior of the pipe 17a between ends of the pipe 17a and is surrounded by dielectric powder (not shown), such as magnesium oxide powder, that fills the interior of the pipe 17a. The electric heater 17 is supported by a heater bracket 19 such that the ends of the pipe 17a are held by the heater bracket 19 via grommets 18, respectively. End terminals of the electric heater 17 are connected to an alternating-current (AC) power source through a power supply circuit that includes the heater protective device (to be described later) and the relays 20 (FIG. 3).

With reference to FIG. 3, the relays 20 include first and second relays 20a and 20b. The first relay 20a is inserted in the power supply circuit on a first side of the electric heater 17, and the second relay 20b is inserted in the power supply circuit on a second side of the electric heater 17 that is opposite to the first side of the electric heater 17. The first and second relays 20a and 20b are normally simultaneously turned on and off, i.e., closed and opened by the controller 9. If one of the first and second relays 20a and 20b is short circuited and thus is always closed, the electric heater 17 can be still appropriately controlled through the other relay 20a or 20b as long as the other relay 20a or 20b is operative.

A temperature of the heater bracket 19 generally gets very high (about 700 degrees Celsius) due to the heat generated from the electric heater 17. Thus, the heater bracket 19 is preferrably fabricated from a non-corrosive heat resistant material, such as stainless steel SUS 430, SUS 316 or the like. As shown in FIG. 2, the heater bracket 19 is supported by the heater cover 16 via an insulator (dielectric member) 21 made, for example, of alumina. More particularly, the heater bracket 19 is secured to the insulator 21 with a bolt 22 that extends through the heater cover 16 and the insulator 21 and also with a nut 23 that is threadably tightened on the bolt 22.

With reference to FIG. 3, the heater protective device includes a couple of thermostats 24 and one thermal fuse 25.

One of the thermostats 24 is interposed in the power supply circuit on the first side of the electric heater 17 and is referred as the first thermostat 24a. The other of the thermostats 24 is interposed in the power supply circuit on the second side of the electric heater 17 and is referred as the second thermostat 24b. With reference to FIG. 4, these two thermostats 24 are secured to opposing sides of one metal plate 26. When a temperature of each thermostat 24 rises due to the heat conducted through the metal plate 26 and substantially reaches 40 degrees Celsius or higher, an internal connection of the thermostat 24 is turned off, i.e., is opened. When the temperature of the thermostat 24 decreases substantially below 40 degrees Celsius, the internal contact of the thermostat 24 is turned on, i.e., is closed.

As shown in FIGS. 2 and 4, the metal plate 26 is secured to a heat receiving bracket 27 that is secured to the heater cover 16 and that is heated upon receiving radiated heat from the electric heater 17.

As shown in FIG. 4, the thermal fuse 25 extends through the metal plate 26 in a thickness direction of the metal plate 26 and is secured thereto. When a temperature of the thermal fuse 25 rises due to the heat conducted through the metal plate 26 and substantially reaches 110 degrees Celsius or higher, the thermal fuse 25 substantially melts or opens to disconnect the power supply circuit.

With reference to FIG. 3, the controller 9 monitors a temperature of the internal air within the housing 3 with a temperature sensor 28, such as a thermistor. The controller 9 controls the external-air fan 6, the internal-air fan 7 and the electric heater 17 based on the measured temperature of the internal air within the housing 3.

Operation of the cooling system 1 will be briefly described.

When the controller 9 is activated, the controller 9 reads the temperature value from the temperature sensor 28 and controls a rotational speed of the internal-air fan 7 based on the measured temperature value of the temperature sensor 28. At this stage, if the measured temperature value of the temperature sensor 28 is substantially equal to or greater than, for example, 25 degrees Celsius (normal temperature), the controller 9 turns on the external-air fan 6. On the other hand, if the measured temperature value of the temperature sensor 28 is below this temperature, the controller 9 turns off the external-air fan 6. Furthermore, if the measured temperature value of the temperature sensor 28 is substantially equal to or below a predetermined temperature value (e.g., 10 degrees Celsius) for energizing the electric heater 17, the controller 9 turns on the relays 20 to energize the electric heater 17.

The electric heater 17 is normally turned on and off through the relays 20. When the relays 20 fail for some reason and thereby cannot be turned off upon the temperature exceeding the predetermined temperature value, the thermostats 24 can be turned off by the heat transmitted through the metal plate 26, so that the electric heater 17 can be deenergized.

Furthermore, when both the thermostats 24 fail (i.e., the thermostats 24 do not turn off upon substantially exceeding 40 degrees Celsius), the thermal fuse 25 substantially melts or opens at a predetermined temperature (e.g., 110 degrees Celsius) to disconnect the power supply circuit, so that the electric heater 17 is deenergized.

The controller 9 also monitors an electric current value with an electric current sensor 29 interposed in the power supply circuit. If any abnormal electric current value is measured with the electric current sensor 29 (for instance, if the measured current value is zero although the relays 20 are turned on, or if an excessive electric current value is measured continuously over a predetermined period of time), the relays 20 are turned off to deenergize the electric heater 17. In addition to or as an alternative to this, a signal indicating the incidence of this abnormality can be sent, for example, to a control center that monitors the base stations.

The present embodiment provides the following advantages.

As described above, the heater protective device arranged in the heater unit 8 includes the first thermostat 24a interposed in the power supply circuit on the first side of the electric heater 17 and the second thermostat 24b interposed in the power supply circuit on the second side of the electric heater 17. Furthermore, the thermostats 24a and 24b are secured to the opposing sides of the metal plate 26. With this arrangement, the two thermostats 24a and 24b are operated under substantially the same temperature condition. Thus, it is possible to simultaneously disconnect the power supply circuit on both the first and second sides of the electric heater 17 when the temperature of the metal plate 26 substantially reaches the predetermined temperature value (temperature value selected for turning off the thermostats 24) or higher. Thus, even if the failure of the relays 20 or the abnormality (e.g., short circuit) of the power supply circuit occurs, the electric heater 17 can be reliably prevented from reaching the abnormally high temperature, providing the safer heater unit 8.

Since the two thermostats 24 are symmetrically arranged on the metal plate 26, the space required for accommodating the thermostats 24 is reduced. Furthermore, since the two thermostats 24 receive the heat from the metal plate 26 under substantially the same condition, the best locations of the two thermostats 24 relative to the electric heater 17 can be easily selected.

As described above, the electric heater 17 used in the heater unit 8 has the heating wire (e.g., nichrome wire) extending through the interior of the pipe 17a and being surrounded by the dielectric powder (e.g., magnesium oxide powder) that fills the interior of the pipe 17a. Therefore, the heating wire does not directly contact the pipe 17a, providing a high degree of dielectricity.

Furthermore, since the heater bracket 19 that supports the electric heater 17 is insulated from the heater cover 16 via the insulator 21, a double insulating structure is achieved according to the present embodiment. For instance, during a maintenance operation, a maintenance worker may touch the heater cover 16 as well as the casing 4 of the cooling system 1 with bare hands. However, the heater bracket 19 that supports the electric heater 17 is insulated from the heater cover 16 via the insulator 21. As a result, even if the insulation of the electric heater 17 fails (short circuiting), excessive electric current will not flow from the heater bracket 19 to the heater cover 16 and to the casing 4 of the cooling system 1. This arrangement assures a higher degree of safety.

Second Embodiment

A second embodiment of the present invention will be described with reference to FIG. 5.

Figure 5:
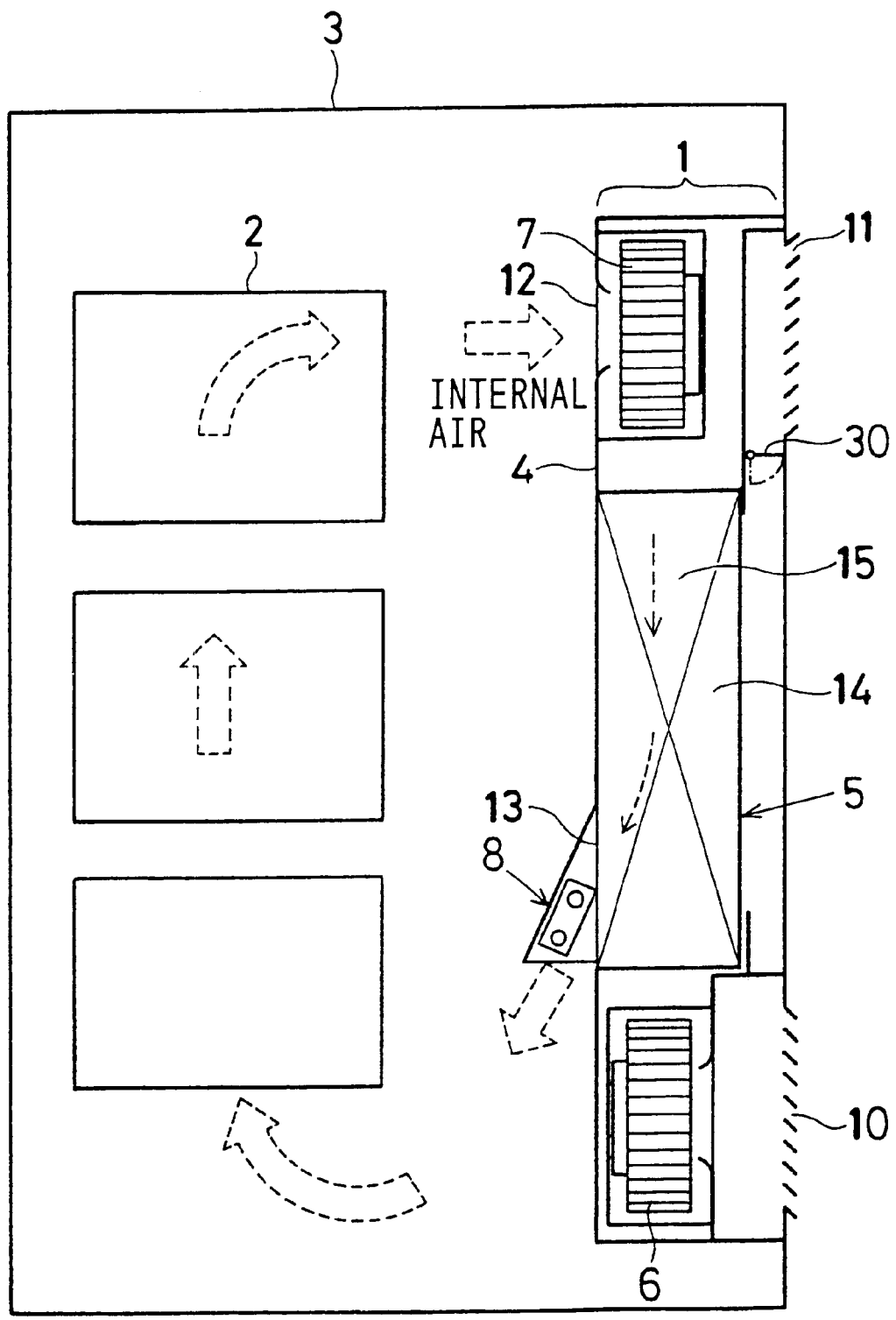
FIG. 5 is a schematic side view of a cooling system according to a second embodiment of the present invention, schematically showing an internal structure of the cooling system.

As shown in FIG. 5, the cooling system 1 of the second embodiment further includes a damper 30 that opens and closes the external-air passage 14 of the casing 4.

When the electric heater 17 is energized, the controller 9 operates the damper 30 to close the external-air passage 14.

In the first embodiment, the external-air fan 6 is turned off when the electric heater 17 is energized. However, in such a case, natural conversion occurs in the external-air passage 14, so that undesirable heat transfer (heat loss) from the internal air to the external air occurs within the heat exchanger 5.

Thus, in the second embodiment, when the electric heater 17 is energized, the external-air fan 6 is turned off, and also the external-air passage 14 is closed by the damper 30. In this way, the natural conversion on the external air side can be restricted, so that the heat transfer (heat loss) from the internal air to the external air within the heat exchanger 5 can be minimized. This arrangement advantageously allows a reduction in power consumption of the electric heater 17.

The damper 30 can be placed at any desired location as long as the damper 30 is able to open and close the external-air passage 14. In addition to or as an alternative to the damper 30, a shutter that opens and closes the external-air inlet 10 or the external air outlet 11 can be provided.

The cooling system 1 according to the first or second embodiment can be modified as follows. That is, in the above-described cooling system 1, the heat exchanger 5 is the air to air heat exchanger that directly exchanges the heat between the internal air and the external air. In place of this air to air heat exchanger, a boiling cooling system that transfers the heat from the internal air to the external air by boiling heat transfer can be used as the heat exchanger 5.

Additional advantages and modifications will readily occur to those skilled in the art. The invention in its broader terms is therefore, not limited to the specific details, representative apparatus, and illustrative examples shown and described.

What is claimed is:

1. A cooling system for cooling an interior of a substantially airtight housing, said cooling system comprising:

an internal-air passage having an internal-air inlet and an internal-air outlet, both said internal-air inlet and said internal-air outlet communicating with an interior of said housing;

an external-air passage having an external-air inlet and an external-air outlet, both said external-air inlet and said external-air outlet communicating with an exterior of said housing;

an internal-air fan that takes in internal air from said interior of said housing through said internal-air inlet and expels said internal air into said interior of said housing through said internal-air outlet;

an external-air fan that takes in external air from said exterior of said housing through said external-air inlet and expels said external air to said exterior of said housing through said external-air outlet;

a heat exchanger that exchanges heat between said internal air introduced into said internal-air passage and said external air introduced into said external-air passage; and a heater unit that heats said internal air introduced into said internal-air passage, said heater unit including:

an electric heater that generates heat upon energization;

a power supply circuit that supplies power to said electric heater;

a heater protective device that is interposed in said power supply circuit, said heater protective device including a first thermostat and a second thermostat, said first thermostat being interposed in said power supply circuit on a first side of said electric heater, said second thermostat being interposed in said power supply circuit on a second side of said electric heater that is opposite to said first side of said electric heater, said first thermostat and said second thermostat being arranged to open substantially at a first predetermined temperature or higher to disconnect said power supply circuit; and a heat receiving plate that receives heat from said electric heater and conducts said heat of said electric heater to said heater protective device, said first thermostat and said second thermostat being secured to said heat receiving plate.

2. A cooling system according to claim 1, wherein said first thermostat and said second thermostat are secured to opposing sides of said heat receiving plate.

3. A cooling system according to claim 1, wherein:

said heater protective device further includes a thermal fuse, said thermal fuse being interposed in said power supply circuit and being secured to said heat receiving plate; and said thermal fuse opens to disconnect said power supply circuit when a temperature of said thermal fuse is substantially equal to or higher than a second predetermined temperature, said second predetermined temperature being higher than said first predetermined temperature.

4. A cooling system according to claim 3, wherein said second predetermined temperature is 110 degrees Celsius.

5. A cooling system according to claim 1, further including a casing, wherein said heater unit further comprises:

a heater bracket that supports said electric heater;

a heater cover that is secured to said casing and supports said heater bracket; and a dielectric member that is interposed between said heater cover and said heater bracket to electrically insulate said heater cover from said heater bracket.

6. A cooling system according to claim 1, further including:

a damper that is disposed in said external air passage to close and open said external-air passage; and a control device that controls said cooling system such that when said electric heater is energized, said control device turns off said external-air fan and closes said external-air passage by operating said damper.

7. A cooling system according to claim 1, wherein said first thermostat and said second thermostat are secured to said heat receiving plate in such a manner that said heat conducted to said heat receiving plate is substantially equally conducted to both said first thermostat and said second thermostat.

8. A cooling system according to claim 1, wherein said first predetermined temperature is 40 degrees Celsius.

* * * * *